United States Patent
Ramkumar et al.

(10) Patent No.: US 6,773,975 B1
(45) Date of Patent: Aug. 10, 2004

(54) FORMATION OF A SHALLOW TRENCH ISOLATION STRUCTURE IN INTEGRATED CIRCUITS

(75) Inventors: Krishnaswamy Ramkumar, San Jose, CA (US); Sundar Narayanan, Santa Clara, CA (US); Shahin Sharifzadeh, Menlo Part, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/326,707

(22) Filed: Dec. 20, 2002

(51) Int. Cl.[7] .......................................... H01L 21/8238
(52) U.S. Cl. ...................... 438/221; 438/434; 438/435; 438/437; 438/448
(58) Field of Search ................................ 438/221, 424, 438/435, 437, 448

(56) References Cited

U.S. PATENT DOCUMENTS

| | | | | |
|---|---|---|---|---|
| 5,866,465 A | * | 2/1999 | Doan et al. | 438/424 |
| 5,950,090 A | * | 9/1999 | Chen et al. | 438/296 |
| 6,323,103 B1 | * | 11/2001 | Rengarajan et al. | 438/424 |
| 6,580,117 B2 | * | 6/2003 | Shimizu | 257/315 |
| 6,596,608 B2 | * | 7/2003 | Saito | 438/424 |

OTHER PUBLICATIONS

Schwalke, U., et al. "Comer–Parasitics–Free Low–Cost Trench Isolation", IEEE Electron Device Letters, Nov. 1999, vol. 20, No. 11; Munich, Germany.

Schwalke, Udo, et al. "Exitgate: The Ultimate Process Architecture for Submicron CMOS Technologies" IEEE Transactions on Electron Devices, Nov. 1997, vol. 44, No. 11; Munich, Germany.

* cited by examiner

Primary Examiner—Amir Zarabian
Assistant Examiner—Christy Novacek
(74) Attorney, Agent, or Firm—Okamoto & Benedicto LLP

(57) ABSTRACT

In one embodiment, a transistor is fabricated by forming gate materials, such as a gate oxide layer and a gate polysilicon layer, prior to forming a shallow trench isolation (STI) structure. Forming the gate materials early in the process minimizes exposure of the STI structure to processing steps that may expose its corners. Also, to minimize cross-diffusion of dopants and to help lower gate resistance, a metal stack comprising a barrier layer and a metal layer may be employed as a conductive line between gates. In one embodiment, the metal stack comprises a barrier layer of tungsten-nitride and a metal layer of tungsten.

16 Claims, 9 Drawing Sheets

FORMATION OF A SHALLOW TRENCH ISOLATION STRUCTURE IN INTEGRATED CIRCUITS

BACKGROUND OF THE INVENTION

1. Field of the Invention

The present invention relates generally to integrated circuits, and more particularly to integrated circuit fabrication processes and structures.

2. Description of the Background Art

Shallow trench isolation (STI) structures are employed to isolate integrated circuit elements in a semiconductor wafer. A conventional STI process includes the steps of etching a trench in a silicon substrate, filling the trench with a gap fill oxide, and chemical-mechanical polishing (CMP) of the gap fill oxide. For metal oxide semiconductor (MOS) transistors, transistor gates are formed in active regions of the wafer typically after the formation of STI structures. STI has gained popularity because it allows for higher device density than LOCOS isolation. STI, however, is not without its share of problems.

One problem with conventional STI processes is that sharp corners of active areas adjacent to the trenches are likely to get exposed during subsequent processing steps. A sharp corner may result in parasitic transistor behavior, such as excessive corner current leakage and inverse narrow width effect. In addition, polysilicon employed as transistor gate material may get deposited in a trench corner and form poly stringers after a gate etch step. Poly stringers are known to cause shorted connections in integrated circuits.

SUMMARY

In one embodiment, a transistor is fabricated by forming gate materials, such as a gate oxide layer and a gate polysilicon layer, prior to forming a shallow trench isolation (STI) structure. Forming the gate materials early in the process minimizes exposure of the STI structure to processing steps that may expose its corners. Also, to minimize cross-diffusion of dopants and to help lower gate resistance, a metal stack comprising a barrier layer and a metal layer may be employed as a conductive line between gates. In one embodiment, the metal stack comprises a barrier layer of tungsten-nitride and a metal layer of tungsten.

These and other features of the present invention will be readily apparent to persons of ordinary skill in the art upon reading the entirety of this disclosure, which includes the accompanying drawings and claims.

Figure 1A:
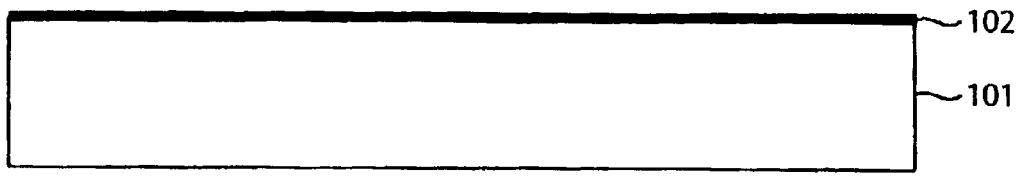
FIGS. 1(*a*) to 1(*q*) show cross-sectional views schematically illustrating the processing of a semiconductor wafer in accordance with an embodiment of the present invention.
Figure 1B:
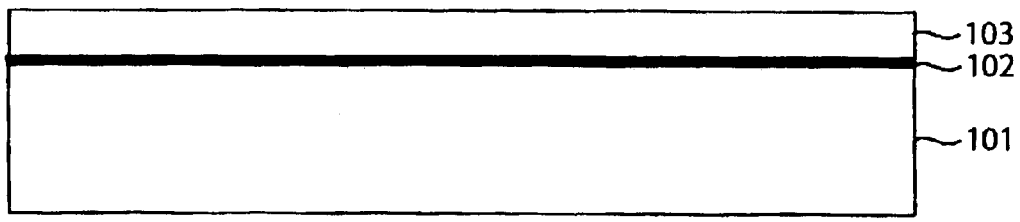
Figure 1C:
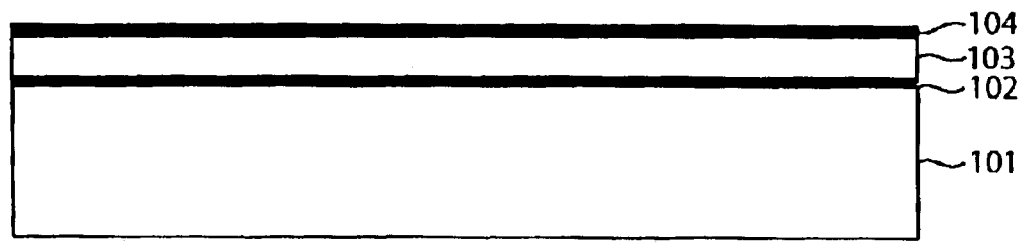
Figure 1D:
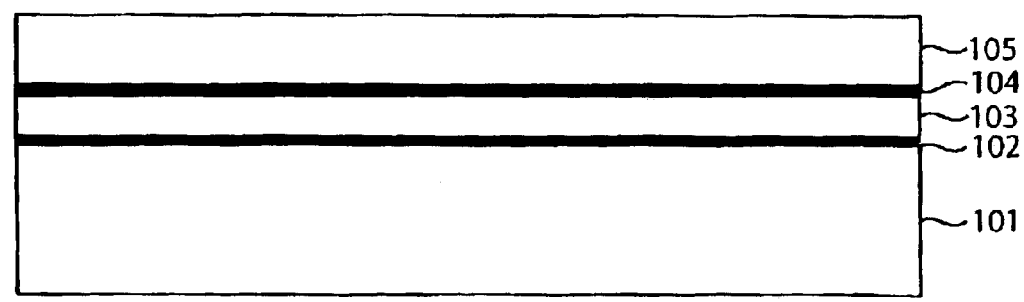
Figure 1E:
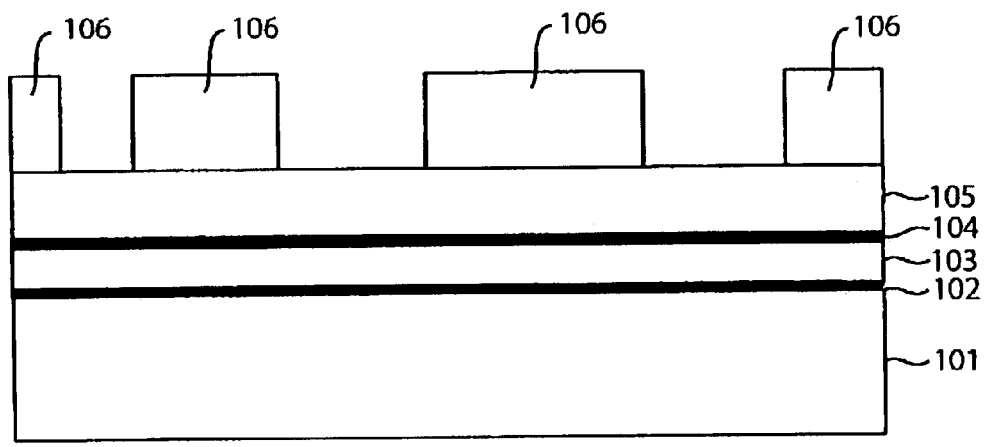

The use of the same reference label in different drawings indicates the same or like components. Drawings are not necessarily to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

FIGS. 1(*a*) to 1(*q*) show cross-sectional views schematically illustrating the processing of a semiconductor wafer in accordance with an embodiment of the present invention. In FIG. 1(*a*), a gate oxide layer 102 is formed over a substrate 101. In one embodiment, gate oxide layer 102 is thermally grown to a thickness of about 20 Angstroms by oxidizing a silicon substrate 101.

In FIG. 1(*b*), a gate polysilicon layer 103 is formed over gate oxide layer 102. In one embodiment, gate polysilicon layer 103 is formed by depositing an amorphous silicon layer to a thickness of about 800 Angstroms by low pressure chemical vapor deposition (LPCVD) at a temperature range of about 500° C. to 600° C. The amorphous silicon layer is then doped using ion implantation and activation steps to form gate polysilicon layer 103. Gate polysilicon layer 103 and gate oxide layer 102 are materials for a transistor gate being fabricated on the wafer. As will be more apparent below, forming gate polysilicon layer 103 and gate oxide layer 102 early in the process and before forming shallow trench isolation structures (STI) advantageously helps prevent exposure of trench corners (and problems associated therewith). In addition, forming gate oxide layer 102 early in the process advantageously allows it to be formed on a fresh, relatively smooth silicon surface that has not undergone any cleaning.

It is to be noted that as used in the present disclosure, the terms "over", "overlying", "under" and "underlying" refer to the relative placement of two materials that may or may not be directly in contact with each other. That is, the two materials may be separated by another material. For example, depending on the application, another material may be formed between gate polysilicon layer 103 and gate oxide layer 102.

In FIG. 1(*c*), an oxide layer 104 is formed over gate polysilicon layer 103. In one embodiment, oxide layer 104 is thermally grown to a thickness of about 50 Angstroms by oxidizing gate polysilicon layer 103. Oxide layer 104 advantageously helps improve the structural integrity of a subsequently deposited polish stop layer of silicon nitride by serving as a stress buffer. However, in applications where a polish stop layer may be directly formed on a gate polysilicon layer without comprising the structural integrity of the polish stop layer, the step of forming oxide layer 104 may be omitted.

In FIG. 1(*d*), a polish stop layer 105 is formed over oxide layer 104. In one embodiment, polish stop layer 105 comprises silicon nitride. A silicon nitride polish stop layer 105 may be deposited to a thickness of about 1500 Angstroms by PECVD. The silicon nitride polish stop layer 105 may also be deposited by low-pressure chemical vapor deposition (LPCVD).

In FIG. 1(*e*), active regions of the wafer are defined by forming a mask over polish stop layer 105. The mask may comprise photoresist 106. Photoresist 106 may be formed over polish stop layer 105 using conventional photolithography techniques. Photoresist 106 covers the active regions of the wafer where a gate may be formed, while leaving trench regions exposed.

In FIG. 1(*f*), trenches 122 are formed in portions of the wafer not covered by photoresist 106. In one embodiment, trenches 122 are formed by etching polish stop layer 105, oxide layer 104, gate polysilicon layer 103, gate oxide layer 102, and substrate 101. Each trench 122 may be about 3000 Angstroms to about 4000 Angstroms deep as measured from the bottom of the trench. Trenches 122 serve as shallow trench isolation (STI) structures, and accordingly are also referred to as "STI trenches".

Figure 1F:
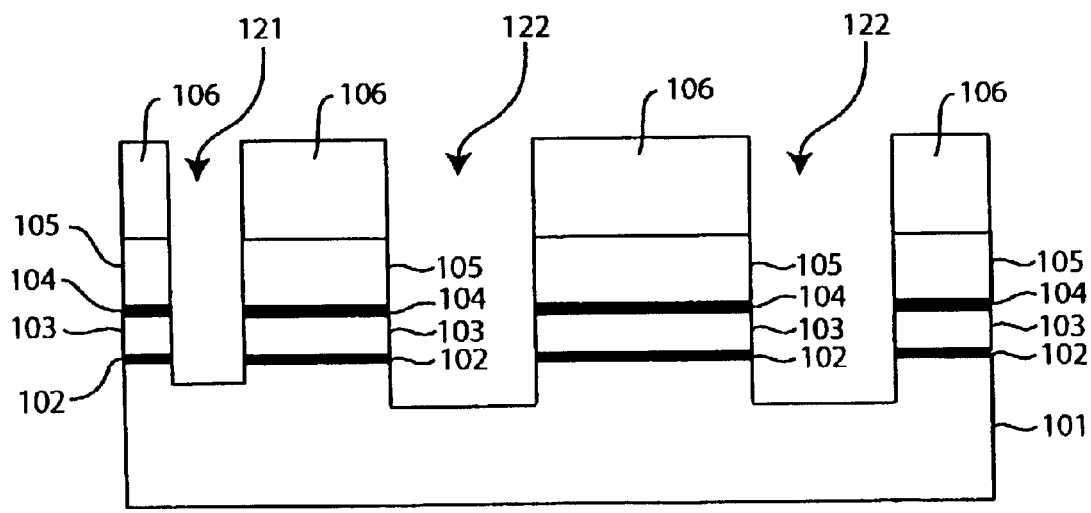

Although not necessary to the understanding of the present invention, a trench 121 is also shown in FIG. 1(f). Trench 121, also referred to as a "zero-mark", is used mainly for alignment purposes. Trench 121 is filled and processed similar to trenches 122, and will not be discussed hereafter.

Figure 1G:
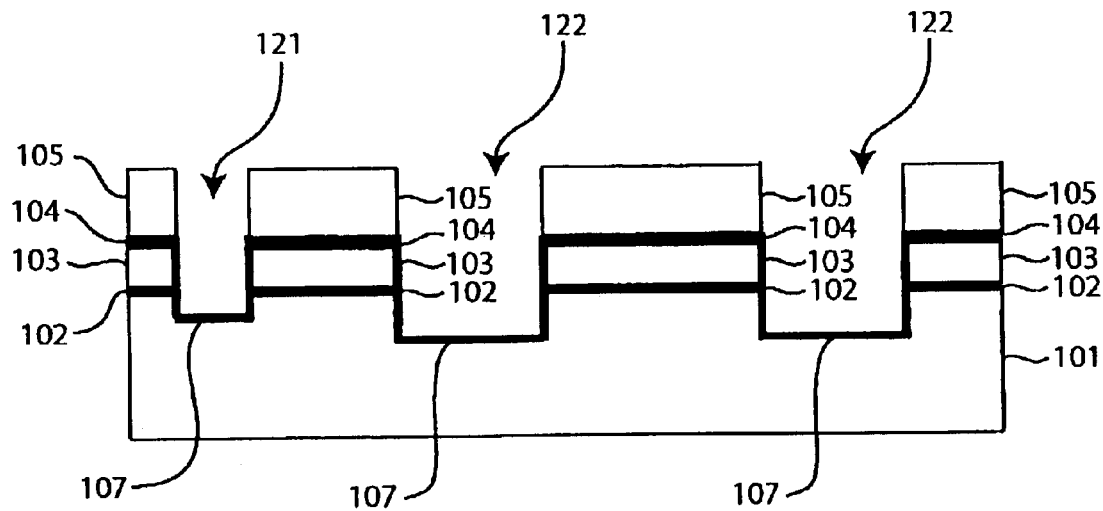

In FIG. 1(g), a liner 107 is formed in each trench 122. In one embodiment, a liner 107 is formed by oxidizing the bottom and sidewalls of a trench 122 up to oxide layer 104. A liner 107 may be thermally grown to a thickness of about 50 Angstroms to about 300 Angstroms, preferably to about 150 Angstroms. Oxidization of trenches 122 advantageously consumes (and thereby smoothes) trench sidewalls that have been damaged by the plasma during the trench etch step.

Also in FIG. 1(g), photoresist 106 is removed (i.e., stripped).

Figure 1H:
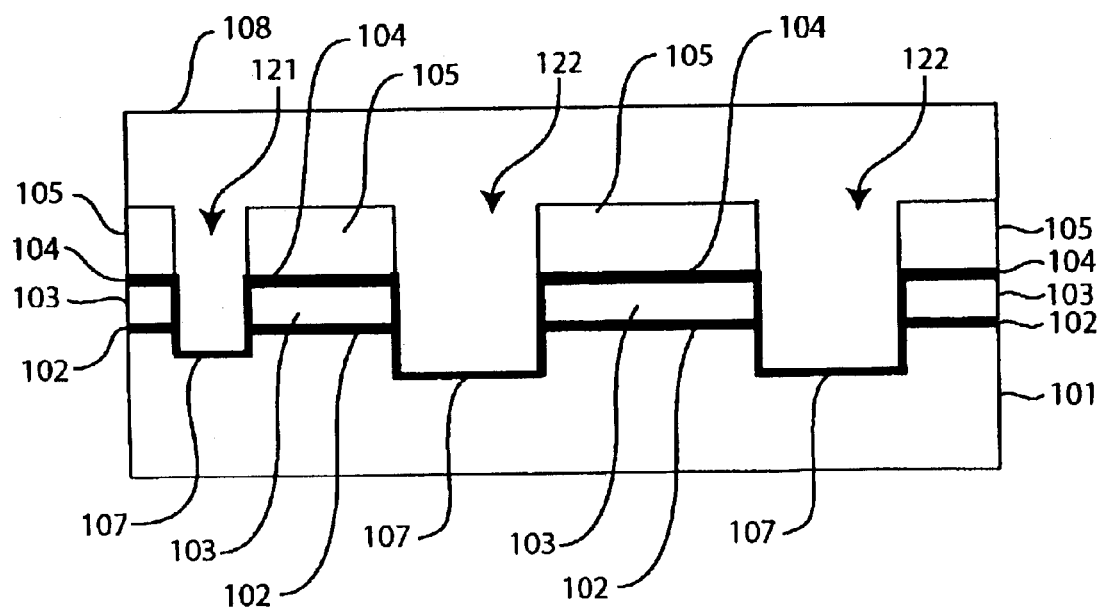

In FIG. 1(h), trenches 122 are filled with a gap fill oxide 108. In one embodiment, gap fill oxide 108 comprises a silicon dioxide layer formed to a thickness of about 5000 Angstroms to about 6000 Angstroms. Gap fill oxide 108 may be deposited by high-density plasma chemical vapor deposition (HDP-CVD) using silane as a precursor.

Figure 1I:
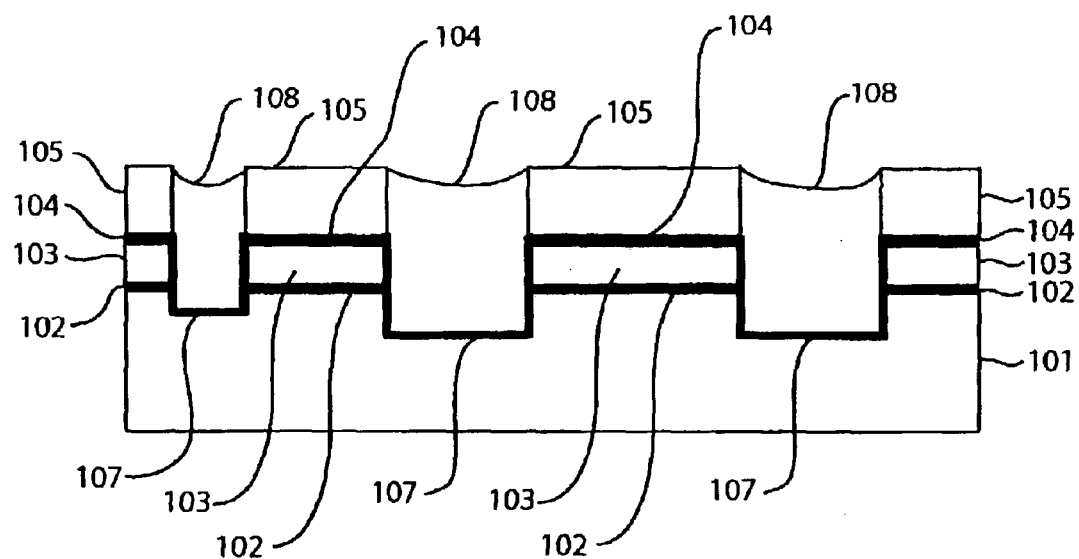

In FIG. 1(i), gap fill oxide 108 is planarized. In one embodiment, gap fill oxide 108 is planarized by chemical-mechanical polishing (CMP) using polish stop layer 105 as a polish stop.

Figure 1J:
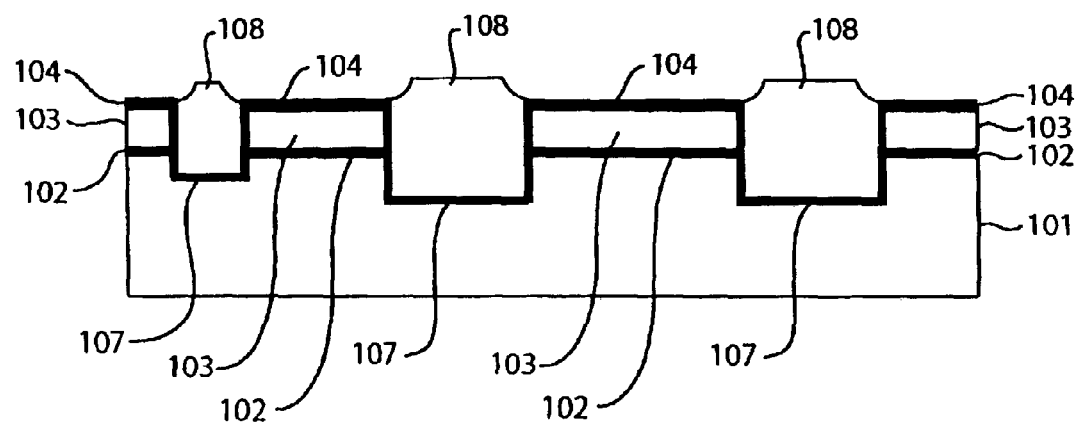

In FIG. 1(j), polish stop layer 105 remaining after the CMP step is removed by a wet strip etch step using hot phosphoric acid at a temperature of about 155° C. to about 165° C. Prior to stripping polish stop layer 105, a wet HF clean step may be performed to remove any fill oxide remaining on polish stop layer 105. The wet HF clean step may result in the removal of some gap fill oxide 108 in the trenches.

As can be appreciated from the foregoing, forming gate oxide layer 102 and gate polysilicon layer 103 (i.e., the gate materials) early in the process helps prevent the corners of the trenches from getting exposed. This is partly because gate oxide layer 102 and gate polysilicon layer 103 are below the top of the trenches, and partly because the corners of the trenches are not exposed to multiple removal (e.g., oxide strip or clean) steps. Additionally, because gate polysilicon layer 103 is formed before the trench etch, wrapping around of polysilicon on top of trench corners is minimized. This advantageously helps prevent poly stringers from forming, and also minimizes leakage current due to formation of a parasitic device at trench corners.

Figure 1K:
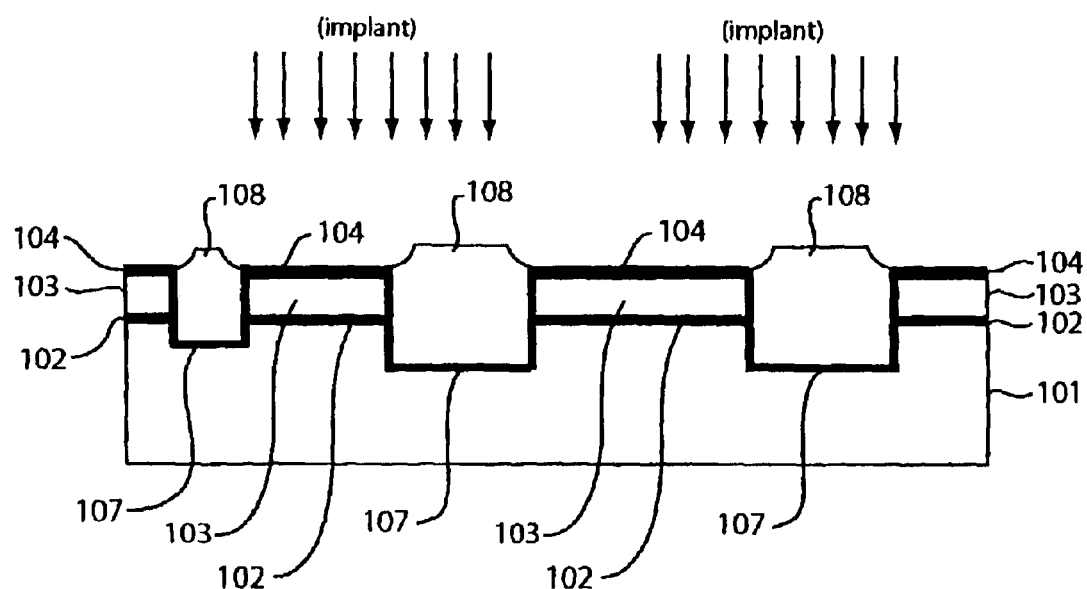

Continuing in FIG. 1(k), core, well, and polysilicon implants and activation steps are conventionally performed.

Figure 1L:
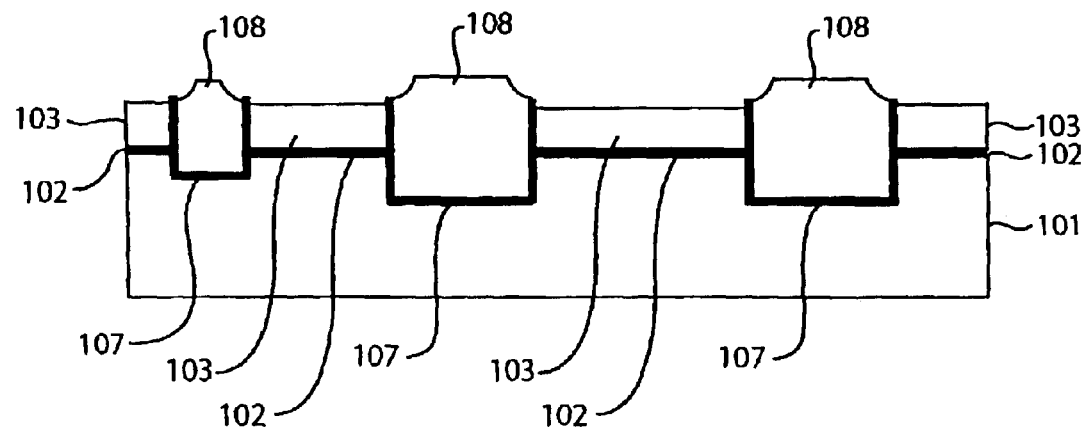

In FIG. 1(l), oxide layer 104 is removed by wet etching.

Figure 1M:
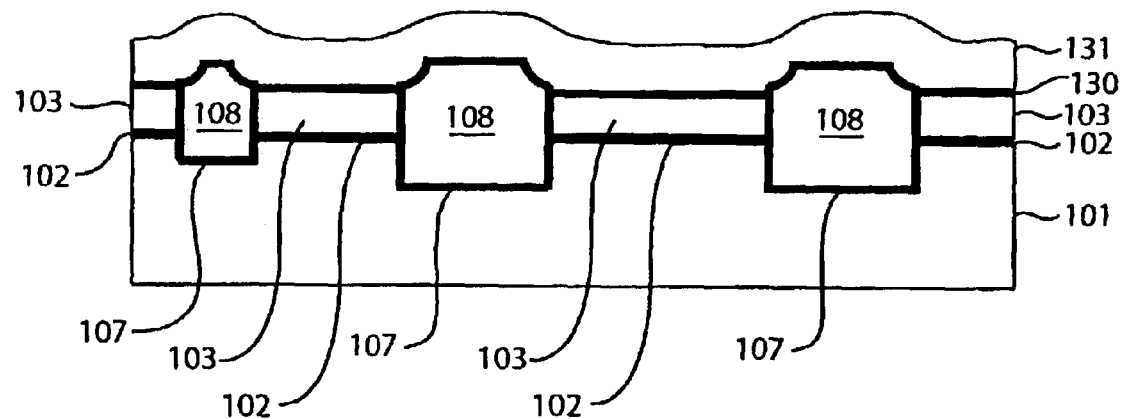

In FIG. 1(m), a metal stack comprising a barrier layer 130 and a metal layer 131 is formed over the sample of FIG. 1(l). The metal stack may be formed across trenches to couple transistors that are in different active regions. For example, the metal stack may be formed across several memory cells.

In one embodiment, barrier layer 130 comprises tungsten-nitride deposited to a thickness of about 50 Angstroms, while metal layer 131 comprises tungsten deposited to a thickness of about 400 Angstroms. Barrier layer 130 and metal layer 131 may be deposited by physical vapor deposition (PVD). Barrier layer 130 advantageously prevents cross-diffusion of dopants from one gate polysilicon layer bounded by one trench structure to a gate polysilicon layer bounded by another trench structure. This is specially beneficial in applications where the metal stack serves as a conductive line coupling an N-type gate to a P-type gate.

Unlike a polysilicon layer, metal layer 131 is naturally conductive and does not need implantation and activation steps. Metal layer 131 also has relatively low resistance compared to a polysilicon layer. A metal layer 131 of tungsten and a barrier layer 130 of tungsten-nitride may be deposited in-situ (i.e., without vacuum break) using a PVD cluster tool of the type available from Applied Materials, Inc. of Santa Clara, Calif. As can be appreciated, in-situ deposition advantageously allows for efficient and cost-effective process flow. Metal layer 131 may also comprise tungsten-silicide, for example.

Figure 1N:
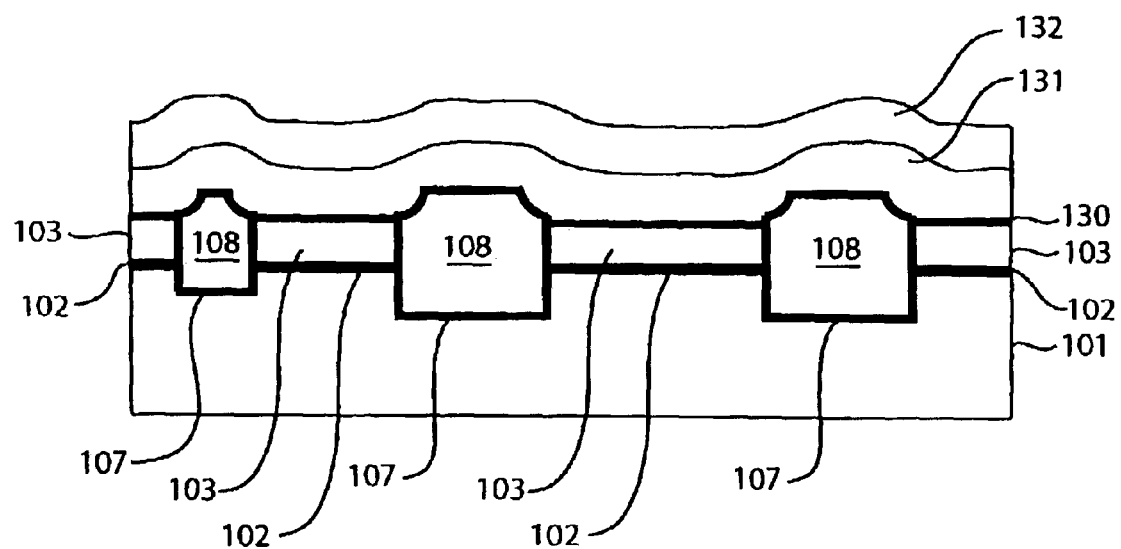

In FIG. 1(n), a capping layer 132 is formed over metal layer 131. In one embodiment, capping layer 132 comprises silicon nitride deposited to a thickness of about 1500 Angstroms to about 2000 Angstroms by LPCVD. The LPCVD process is preferably performed at a relatively low temperature (e.g., about 400° C.) to prevent oxidation of an underlying metal layer 131 of tungsten.

Figure 1O:
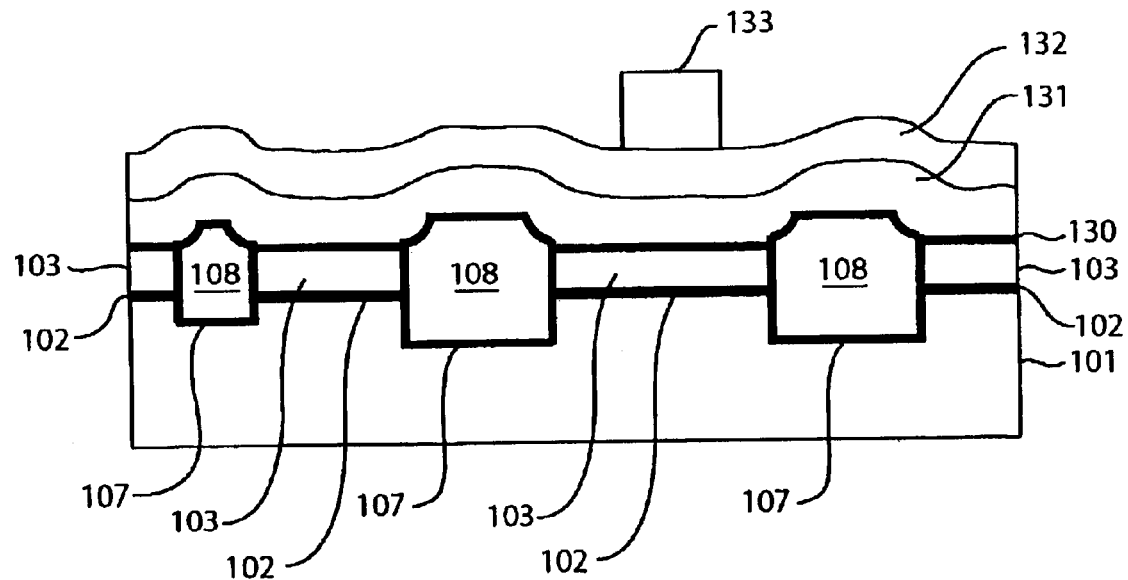

In FIG. 1(o), a gate mask 133 is formed over capping layer 132. Gate mask 133 defines a gate comprising gate oxide layer 102 and gate polysilicon layer 103. In one embodiment, gate mask 133 comprises a photoresist material.

Figure 1P:
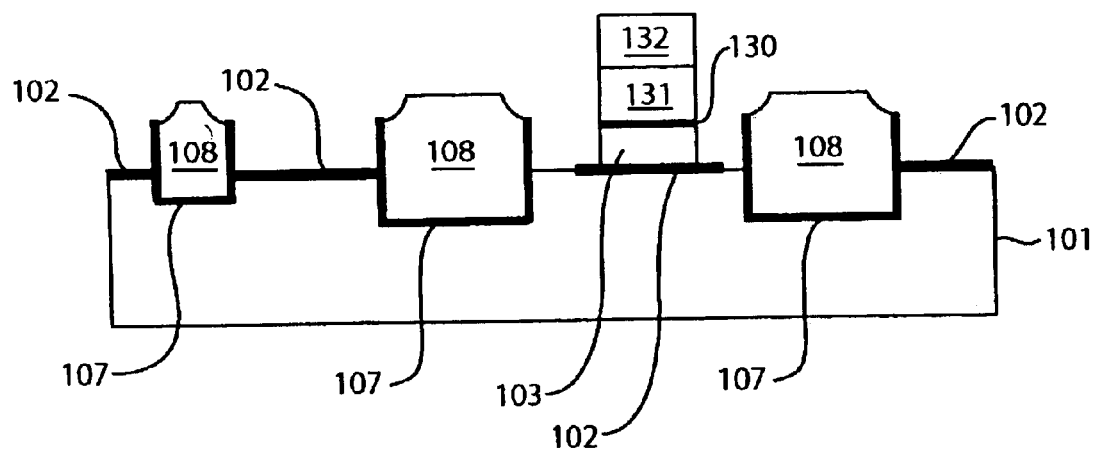

In FIG. 1(p), a gate is formed by etching gate polysilicon layer 103. Forming of the gate also forms a conductive line comprising barrier layer 130 and metal layer 131, and capping layer 132 over the conductive line. The conductive line couples the gate to other gates not shown. As mentioned, barrier layer 130 helps prevent cross-diffusion between gate polysilicon layers by way of metal layer 131.

Figure 2A:
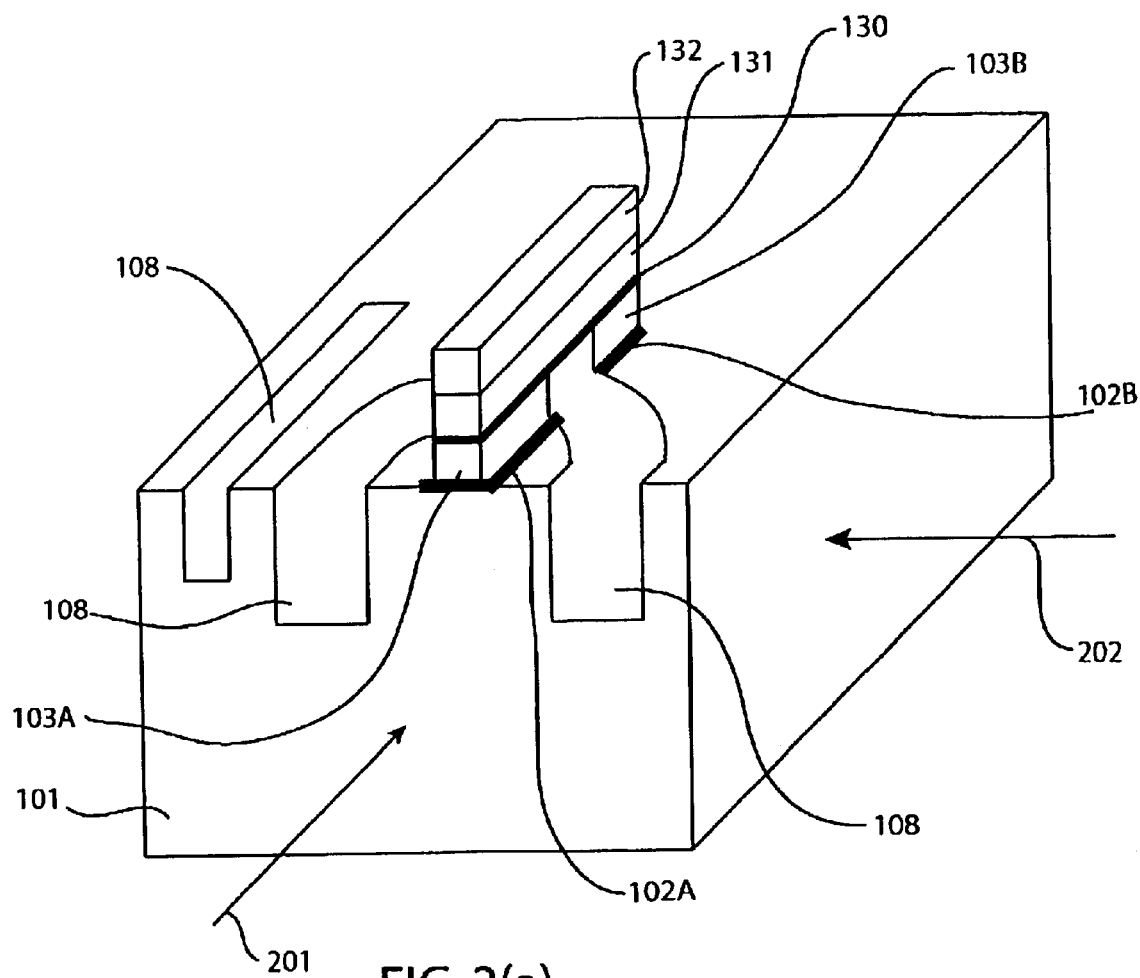
FIGS. 2(*a*) and 2(*b*) schematically show other views of the sample shown in FIG. 1(*p*).
Figure 2B:
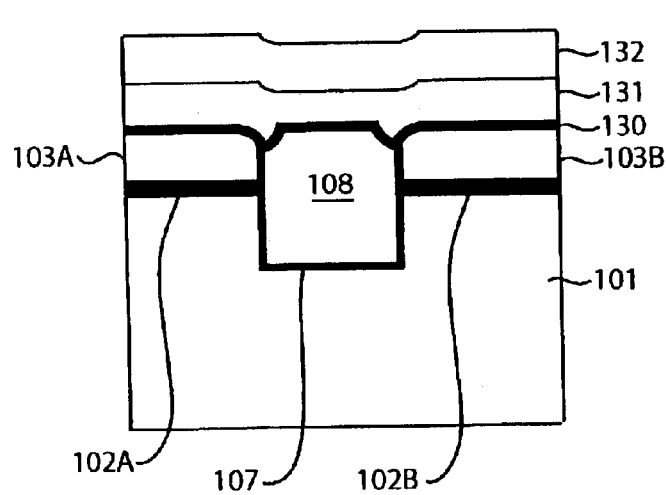

FIGS. 2(a) and 2(b) schematically show other views of the sample of FIG. 1(p). In FIG. 2(a), gate oxide layer 102 has been relabeled "gate oxide layer 102A" to represent the gate oxide of one transistor and "gate oxide layer 102B" to represent the gate oxide of another transistor. Similarly, gate polysilicon layer 103 has been relabeled "gate polysilicon layer 103A" to represent the gate polysilicon layer of one transistor and "gate polysilicon layer 103B" to represent the gate polysilicon layer of another transistor.

Still referring to FIG. 2(a), the view shown in FIG. 1(p) is indicated by an arrow 201, while the view shown in FIG. 2(b) is indicated by an arrow 202. As shown in FIGS. 2(a) and 2(b), the conductive line comprising barrier layer 130 and metal layer 131 couples one gate to another. Specifically, the conductive line couples the gate comprising gate oxide layer 102A and gate polysilicon layer 103A to the gate comprising gate oxide layer 102B and gate polysilicon layer 103B. Capping layer 132 covers the conductive line.

Figure 1Q:
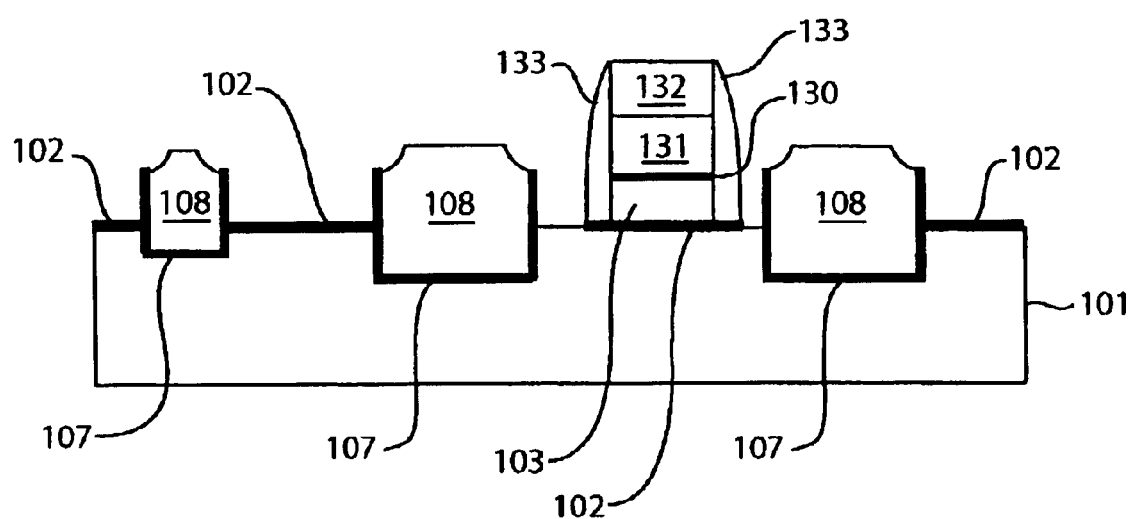

Continuing In FIG. 1(q), spacers 133 are formed on the sidewalls of capping layer 132, metal layer 131, barrier layer 130, gate polysilicon layer 103, and gate oxide layer 102. Conventional process steps are thereafter performed to complete the processing of the wafer.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a transistor, the method comprising:

forming a shallow trench isolation (STI) structure through a gate oxide layer, a gate polysilicon layer, and a polish stop layer;

removing the polish stop layer to expose the gate polysilicon layer;

forming a barrier layer over the gate polysilicon layer;

forming a metal layer over the barrier layer; and etching the gate polysilicon layer, the barrier layer, and the metal layer to form a transistor gate.

2. The method of claim 1 wherein the metal layer comprises tungsten.

3. The method of claim 1 wherein the barrier layer comprises tungsten-nitride.

4. The method of claim 1 wherein forming the STI structure comprises:

forming a trench in the polish stop layer, the polysilicon gate layer, the gate oxide layer, and a substrate;

filling the trench with fill oxide; and performing chemical-mechanical polishing (CMP) on the fill oxide to stop on the polish stop layer.

5. The method of claim 4 wherein the polish stop layer comprises silicon nitride.

6. The method of claim 4 further comprising:

forming an oxide liner in the trench prior to filling the trench with the gap fill oxide.

7. The method of claim 1 further comprising:

oxidizing a top surface of the gate polysilicon layer before forming the barrier layer.

8. The method of claim 1 further comprising forming a capping layer over the metal layer.

9. The method of claim 8 wherein the capping layer comprises silicon nitride.

10. A method of fabricating an integrated circuit, the method comprising:

forming a gate oxide layer over a silicon material;

forming a gate polysilicon layer over the gate oxide layer;

forming a polish stop layer over the gate polysilicon layer;

forming a shallow trench isolation (STI) structure in the gate polysilicon layer, the gate oxide layer, and the silicon material;

removing the polish stop layer to expose the gate polysilicon layer;

forming a barrier layer over the gate polysilicon layer; and etching the gate polysilicon layer and the barrier layer to form a transistor gate.

11. The method of claim 10 further comprising:

forming a metal layer over the barrier layer prior to etching the gate polysilicon layer and the barrier layer.

12. The method of claim 11 wherein the metal layer comprises tungsten and the barrier layer comprises tungsten-nitride.

13. The method of claim 11 further comprising:

forming a capping layer over the metal layer.

14. The method of claim 10 further comprising:

oxidizing a top surface of the ate polysilicon layer prior to forming the barrier layer.

15. The method of claim 14 wherein the polish stop layer is formed over an oxide that is on the top surface of the gate polysilicon layer.

16. The method of claim 10 wherein the silicon material comprises a silicon substrate.

* * * * *

UNITED STATES PATENT AND TRADEMARK OFFICE
CERTIFICATE OF CORRECTION

PATENT NO. : 6,773,975 B1
DATED : August 10, 2004
INVENTOR(S) : Ramkumar et al.

It is certified that error appears in the above-identified patent and that said Letters Patent is hereby corrected as shown below:

<u>Column 6,</u>
Lines 26-28, claim 14 should read,
-- 14. The method of claim 10 further comprising:
oxidizing a top surface of the gate polysilicon layer prior to forming the barrier layer. --

Signed and Sealed this

Fourteenth Day of December, 2004

JON W. DUDAS
*Director of the United States Patent and Trademark Office*